(12) United States Patent
Hetzler

(10) Patent No.: US 10,161,966 B2
(45) Date of Patent: Dec. 25, 2018

(54) RESISTOR, IN PARTICULAR LOW-RESISTANCE CURRENT MEASURING RESISTOR

(71) Applicant: Isabellenhuette Heusler GmbH & Co. KG, Dillenburg (DE)

(72) Inventor: Ullrich Hetzler, Dillenburg-Oberscheld (DE)

(73) Assignee: Isabellenhuette Heusler GmbH & Co. KG, Dillenburg (DE)

( * ) Notice: Subject to any disclaimer, the term of this patent is extended or adjusted under 35 U.S.C. 154(b) by 44 days.

(21) Appl. No.: 15/329,084

(22) PCT Filed: Jul. 22, 2015

(86) PCT No.: PCT/EP2015/001508
§ 371 (c)(1),
(2) Date: Jan. 25, 2017

(87) PCT Pub. No.: WO2016/015842
PCT Pub. Date: Feb. 4, 2016

(65) Prior Publication Data
US 2017/0212148 A1    Jul. 27, 2017

(30) Foreign Application Priority Data
Aug. 1, 2014   (DE) .......................... 10 2014 011 593

(51) Int. Cl.
*G01R 1/20* (2006.01)
*H01C 1/14* (2006.01)
(Continued)

(52) U.S. Cl.
CPC .............. *G01R 1/203* (2013.01); *H01C 1/14* (2013.01); *H02G 5/02* (2013.01); *H05K 1/0306* (2013.01);
(Continued)

(58) Field of Classification Search
USPC ........................................................ 324/126
See application file for complete search history.

(56) References Cited

U.S. PATENT DOCUMENTS

| 4,259,365 A | * | 3/1981 | Ruppel | ................ | H01L 37/02 |
| | | | | | 23/302 T |
| 4,317,104 A | * | 2/1982 | Bergmann | ............ | G01R 1/203 |
| | | | | | 338/290 |

(Continued)

FOREIGN PATENT DOCUMENTS

| DE | 2114466 B1 | 8/1972 |
| DE | 102009031408 A1 | 1/2011 |

(Continued)

OTHER PUBLICATIONS

English language abstract for DE 102011121902 A1 (2013).
(Continued)

*Primary Examiner* — William H Mayo, III
*Assistant Examiner* — Krystal Robinson
(74) *Attorney, Agent, or Firm* — Caesar Rivise, PC

(57) ABSTRACT

The invention relates to a U-shaped resistor (1), in particular a low-resistance current-measuring resistor (1), comprising a first connection part (2) made of a conductive material having a first current contact surface for conducting an electrical current (I) into the resistor (1), and comprising a second connection part (3) made of a conductive material having a second current contact surface for conducting the current (I) out of the resistor (1), as well as comprising a resistor element (4) made of a resistor material, wherein the resistor element (4) is arranged in the direction of current flow between the first connection part (2) and the second connection part (3), such that the electrical current (I) flows through the electrical resistor (1). The current (I) perpendicularly enters or leaves the connections parts (2, 3) via their outer surfaces. In addition, the voltage taps are attached (Continued)

to the inner side of the U-shaped resistor (1), and contact the connection parts (2, 3) close to the transition to the resistor element (4).

24 Claims, 5 Drawing Sheets

(51) Int. Cl.
*H02G 5/02* (2006.01)
*H05K 1/03* (2006.01)
*H05K 1/11* (2006.01)
*H05K 1/18* (2006.01)

(52) U.S. Cl.
CPC ............ *H05K 1/111* (2013.01); *H05K 1/181* (2013.01); *H05K 2201/10022* (2013.01); *H05K 2201/10151* (2013.01)

(56) References Cited

U.S. PATENT DOCUMENTS

| | | | |
|---|---|---|---|
| 4,322,710 A * | 3/1982 | Carson | H01C 7/13 |
| | | | 338/272 |
| 4,580,095 A | 4/1986 | De Vries | |
| 4,667,516 A * | 5/1987 | Schulz | G01L 9/065 |
| | | | 323/367 |
| 5,013,948 A * | 5/1991 | Tumpey | C03C 8/02 |
| | | | 257/909 |
| 6,876,104 B1 * | 4/2005 | Guo | H05K 1/167 |
| | | | 307/10.1 |
| 2004/0263150 A1 * | 12/2004 | Hetzler | G01R 1/203 |
| | | | 324/126 |
| 2010/0066351 A1 | 3/2010 | Condamin et al. | |
| 2011/0006754 A1 * | 1/2011 | Biggadike | G01R 1/203 |
| | | | 324/126 |
| 2011/0050260 A1 | 3/2011 | Teramoto et al. | |
| 2011/0156687 A1 * | 6/2011 | Gardner | H02M 3/156 |
| | | | 323/284 |
| 2011/0241649 A1 * | 10/2011 | Ozawa | G01R 31/3696 |
| | | | 324/76.11 |
| 2012/0154104 A1 | 6/2012 | Hetzler | |
| 2014/0152313 A1 * | 6/2014 | Hetzler | G01R 31/3624 |
| | | | 324/426 |

FOREIGN PATENT DOCUMENTS

| | | |
|---|---|---|
| DE | 102010037235 A1 | 3/2011 |
| DE | 102011121902 A1 | 6/2013 |
| DE | 202013011690 U1 | 4/2014 |
| DE | 102013200580 A1 | 7/2014 |
| EP | 0605800 A1 | 7/1994 |
| JP | 2000131349 A | 5/2000 |
| WO | 9909421 A1 | 2/1999 |
| WO | 2014111188 A1 | 7/2014 |

OTHER PUBLICATIONS

English language abstract for DE 202013011690 U1 (2014).
English language abstract for EP 0605800 A1 (1994).
English language abstract for JP 2000131349 A (2000).
International Search Report for PCT/EP2015/001508 dated Sep. 28, 2015.

* cited by examiner

RESISTOR, IN PARTICULAR LOW-RESISTANCE CURRENT MEASURING RESISTOR

CROSS-REFERENCE TO RELATED APPLICATIONS

This application is the U.S. National Phase Application of PCT/EP2015/001508, filed Jul. 22, 2015, which claims priority from DE 10 2014 011 593.3, filed Aug. 1, 2014, the contents of which applications are incorporated herein by reference in their entireties for all purposes.

BACKGROUND OF THE INVENTION

The invention relates to a resistor, particularly a low-resistance current-measuring resistor.

A low-resistance current measuring resistor ("shunt") is known from EP 0 605 800 A1, which can be detached from a composite material strip, which enables economical manufacture. This known current measuring resistor consists of two plate-shaped, flat connection parts made of a conductive material (e.g. copper) and a resistor element located in between, also plate-shaped and flat, made of a resistive material (e.g. copper-manganese-nickel alloy). In this arrangement, the electric current to be measured is conducted into the current measuring resistor via the connection part and then conducted out of the current measuring resistor via the other connection part so that the electric current to be measured flows through the resistor element. In this arrangement, the actual current measurement is carried out according to the known four-conductor method by measuring the voltage drop across the resistor element, the measured voltage drop reproducing the electric current that flows through the resistor element in accordance with Ohm's Law.

In more recent applications of such current measuring resistors in the field of drive engineering and particularly in the field of electromobility, the requirements for a compact, cheap construction design for the power electronics package are decisive. In this case, optimized construction and connecting methods now also require new structural shapes for the current measuring resistors and solutions for the corresponding measurement method. However, the known current measuring resistor described above does not fully satisfy these requirements.

In addition, a plate-shaped current-measuring resistor is known from EP 0 605 800 A1 and also from DE 10 2009 031 408 A1, which is U-shaped in the plate plane. In this arrangement, the current contact surfaces and also the voltage taps are each arranged on the same side of the plate-shaped current-measuring resistor, e.g. on the upper side of the plate-shaped current measuring resistor. Thus, this construction design of a current measuring resistor also has the disadvantages described above.

Furthermore, US 2010/0066351 A1, DE 2 114 466 C, U.S. Pat. No. 4,580,095, DE 10 2010 037 235 A1, DE 20 2013 011 690 U1 and DE 10 2011 121 902 A1 should be mentioned as prior art.

The object of the invention is therefore to create an appropriately improved current measuring resistor.

This object is achieved by a resistor according to the invention.

SUMMARY OF THE INVENTION

Initially in agreement with the prior art, the resistor according to the invention has two connection parts to conduct an electric current into the resistor and to conduct it out of the resistor.

The two connection parts consist of a good electrically-conductive conductive material (e.g. copper or a copper alloy or also aluminum) to ensure as far as possible that the voltage measurement according to the four-conductor method is not falsified by a voltage drop within the connection parts.

The two connection parts each have a current contact surface to conduct the electric current in and out, said surface enabling a planar conducting in and out of the electric current with a correspondingly low transition resistance. This must be differentiated from a traditional conducting in and out of the electric current via current contacts that are almost dot or line-shaped.

According to the invention, the current contact surfaces for conducting the current in and out are each located on the outer side of the two connection parts. This means that conducting the current in and out takes place on opposite sides of the resistor. In this arrangement, the current flow direction to the two current contact surfaces is preferably unidirectional, i.e. the current flows on the one current contact surface in the same direction into the resistor as it flows on the other current contact surface out of the resistor.

In addition, a resistor element is also provided in the resistor according to the invention in keeping with the prior art, said element being arranged in the current flow direction between the two connection parts so that the electric current flows through the electric resistor. In this arrangement, the resistor element consists of a resistive material (e.g. copper-manganese-nickel alloy), the specific electrical resistance of the resistive material being markedly greater than the specific electrical resistance of the conductive material of the connection parts.

The invention is characterized in that at least one part of the resistor is essentially U-shaped in cross-section. This is preferably achieved by the whole resistor in cross-section being bent essentially in a U-shape with limbs that are formed by the two connection parts and a base that is formed by the resistor element.

The term U-shape used within the scope of this invention in the case of a plate-shaped resistor or a resistor with plate-shaped connection parts or a plate-shaped resistor element preferably refers to a cross-section at right angles to the plate plane. The resistor according to the invention thus also differs, for example, from the U-shaped resistors according to EP 0 605 800 A1 and DE 10 2009 031, in which the resistor is U-shaped in the plate plane.

In this connection, it should be mentioned that the term U-shaped resistor used within the scope of the invention is not limited to resistors that are exactly U-shaped in cross-section, i.e. with right angles between the base and the limbs and a rounding between the base and the limbs. Rather, the term U-shape within the scope of the invention also includes other angles between the base and the limbs of the U-shape. In addition, the term U-shape within the scope of the invention also includes U-shapes without a rounding between the base of the U-shape and the limbs. In addition, it should also be mentioned with regard to the U-shape within the scope of the invention that this term does not require the whole resistor to be U-shaped. Rather, the invention also claims protection for variants, where only one part of the resistor is U-shaped in cross-section.

In the initially described traditional current measuring resistor according to EP 0 605 800 A1, the connection parts with their current contact surfaces lie in a common plane. However, this known arrangement of a current measuring resistor is still not optimum with regard to the possibilities for optimized construction and connecting methods. The invention preferably provides that the two current contact surfaces of the two connection parts are, at least partially, essentially arranged parallel, particularly plane-parallel, to each other in two contact surfaces spaced apart from each other.

It has already been mentioned above that the current measuring resistor enables a current measurement according to the known four-conductor method, for which at least two voltage taps are necessary, which measure the voltage drop across the resistor element. Thus, in a single pair of voltage taps, the one voltage tap contacts the one connection part as close as possible to the transition between connection part and resistor element, while the other voltage tap contacts the other connection part in the same way. In the current measuring resistor according to the invention, these voltage taps are provided on the inner side of the two connection parts.

In addition, it should be mentioned that the current density in the two connection parts can fluctuate spatially since the current infeed points on the contact surfaces of the connection parts can fluctuate, and the specific electrical conductivity of the conductive material of the connection parts is not infinite. The consequence of this is that the voltage measurement using the four-conductor method fluctuates in relation to the spatial positioning of the voltage taps. However, such fluctuations in relation to the spatial positioning of the voltage taps falsify the measurement result. Thus, in a variant of the invention, it is provided that the two connection parts are each contacted by a plurality of voltage taps, which are arranged adjacently in the current flow direction and distributed across the width of the connection parts. Thus, the measurement of the voltage drop across the resistor element is carried out preferably by a plurality of pairs of voltage taps, which are arranged adjacently in the current flow direction and distributed across the width of the connection parts. The different pairs of voltage taps then deliver different measurement values for the voltage drop across the resistor element, it then being possible for a corrected value to be calculated from the different measurement values, for example, by mean value formation.

To that end, the voltage taps can be connected via individual balancing resistors to a measurement connection, the balancing resistors compensating asymmetries in current density in the connection parts and in the resistor element through appropriately adjusted resistance values. This plurality of voltage taps is preferably arranged in the inner space of the resistor.

In the preferred embodiment of the invention, a part of a measurement device is also arranged in the inner space of the resistor enclosed by the connection parts, said device being installed to measure the voltage drop across the resistor element.

Preferably, this part of a measurement device is a printed circuit board, which can support a measurement circuit in order to measure the voltage drop across the resistor element.

This measurement circuit can be, for example, a customer-specific circuit (ASIC: Application-Specific Integrated Circuit), as known per se from EP 1 363 131 A1.

Moreover, the printed circuit board can also support an optocoupler or an inductive or capacitive coupler in order to enable galvanically isolated communication with the environment. Alternatively, a voltage signal can be emitted via the coupler, said signal reproducing the voltage drop across the resistor element.

Within the scope of the invention, the printed circuit board can also have soldering support surfaces to mechanically stabilize the resistor and the composite made up of the connection parts, the resistor element and the printed circuit board when soldering, sintering or bonding.

In addition, the printed circuit board can have connection pads which as voltage taps electrically contact the connection parts to measure the voltage drop across the resistor element. In this arrangement, therefore, the connection pads on the printed circuit board preferably directly form the voltage taps for measuring the voltage drop across the resistor element.

In addition, it should be mentioned that the printed circuit board can be multilayered, the connection pads and the soldering support surfaces each being arranged on outer layers of the printed circuit board. The electrical connection to the connection pads of the printed circuit board preferably occurs via striplines, which are arranged on inner layers of the printed circuit board and which are connected to the connection pads by through-holes. In this arrangement, it is preferable if the striplines run over each other under cover on opposite-lying sides of the inner layer to minimize the inputting of stray radiation.

In this arrangement, the printed circuit board is preferably connected to the resistor by a mechanical connection so that the resistor forms a composite with the printed circuit board. This connection can be, for example, a soldered connection, a sintered connection, a crimped connection or an adhesive connection with an electrically conductive adhesive.

In addition, in the context of the printed circuit board, it should be mentioned that the printed circuit board is rigid or flexible and resistant to high temperatures, for example, up to a temperature of at least +150° C., +200° C. or even +250° C. However, there is the possibility that the printed circuit board consists of multilayer ceramics.

In a variant of the invention, the resistor element has a cross-section perpendicular to the current flow direction, which deviates from a pure rectangular shape. For example, the resistor element can be multiply bent or angled so that the resistor after assembly to the connection parts surrounds an inner space and at least partially encloses it. In this arrangement, the resistor can have at least one limb, which extends in the current flow direction and projects inwards into the inner space. For example, three webs can protrude into the inner space of the resistor. In this arrangement, it can be advantageous if at least one of the limbs is electrically contacted at its free end by one of the voltage taps. However, it can also be advantageous if one or more of the limbs is each electrically contacted on its base by one of the voltage taps.

Generally, it should be mentioned that the connection parts and the resistor element are preferably plate-shaped. This means preferably that the connection parts and the resistor element are relatively thin, upper and lower side running parallel to each other, particularly plane-parallel. The resistor element and the connection parts can be optionally flat or bent in this arrangement.

Regarding the conductive material of the connection parts, it should be mentioned that this is preferably copper or a copper alloy.

Regarding the resistive material of the resistor element, it should be mentioned that it can be, for example, a copper-manganese alloy such as, for example, a copper-manganese-nickel alloy (e.g. Manganin®, i.e. Cu86Mn12Ni2). However, there is the alternative possibility that the resistive material consists of a nickel-chromium alloy or another alloy.

In addition, it should be mentioned that, although the resistive material of the resistor element preferably has low resistance, it has a markedly greater specific electrical resistance than the conductive material of the connection parts.

For example, the resistive material of the resistor element can have a specific electrical resistance which lies within the range of $1 \cdot 10^{-7}$ Ωm to $50 \cdot 10^{-7}$ Ωm.

The resistor as a whole can have a resistance value within the scope of the invention which lies, for example, within the range of 0.1μΩ to 1000μΩ.

In addition, it should be mentioned that the resistor according to the invention preferably has high continuous current-carrying capacity of at least 100 A, 1 kA, 2 kA, 5 kA or 10 kA.

It has already been briefly mentioned above that the current contact surfaces of the connection parts enable planar current conducting in and out, which is associated with a correspondingly low transition resistance. Preferably, the current contact surfaces are thus large enough that each makes up at least 30%, 60% or even at least 90% of the total outer surface of the resistor. For example, the size of the current contact surfaces are at least 5 cm², 10 cm², 15 cm², 20 cm², 25 cm² or even at least 30 cm².

In addition, it should be mentioned that the arrangement of the current measuring resistor according to the invention preferably results in the current flow direction in the first connection part being opposite the current flow direction in the second connection part, which leads to a pseudo-bifilar current path with a correspondingly low resistor inductance. Thus, the inductance of the resistor can be, for example, less than 5 nH, 2 nH or even 1 nH.

In addition, regarding the properties of the resistor according to the invention, it should be mentioned that the resistor preferably has a low temperature coefficient of less than 100 ppm/K, 50 ppm/K or even less than 20 ppm/K.

In contrast, the thermal resistance between the current contact surfaces of the two connection parts is preferably less than 10 K/W, 5 K/W, 2 K/W or even 1 K/W.

The manufacture of the current measuring resistor according to the invention can be carried out, for example, by detaching and bending from a composite material strip. However, it is also possible and, with certain embodiments, even necessary that the resistor is composed of at least three separate parts.

In addition, it should be mentioned that the current contact surfaces and the two connection parts in the resistor according to the invention preferably lie sandwich-like over each other.

Regarding the dimensions of the resistor according to the invention, a possibility exists for a width perpendicular to the current flow direction and for a length in the current flow direction each of 20 mm-100 mm and a thickness of 3 mm-20 mm, extensive modifications to these dimensions also being possible.

Finally, the invention claims protection not only for the aforementioned resistor according to the invention as an individual component. Rather, the invention also claims protection for a busbar arrangement with two busbars for supplying and discharging the electrical current and comprising a resistor according to the invention, which is arranged between the two busbars by which it is electrically contacted, the busbars contacting the current contact surfaces of the two connection parts of the resistor according to the invention.

In a variant of such a busbar arrangement, the two busbars are each L-shaped, the resistor being enclosed by two limbs of the two L-shaped busbars.

In contrast, in another variant of such a busbar arrangement, one of the two busbars is L-shaped while the other busbar is essentially plate-shaped and flat. In this arrangement, the resistor according to the invention is enclosed, on the one hand, between the flat, plate-shaped busbar and, on the other hand, a limb of the L-shaped busbar.

In contrast, in yet another variant of such a busbar arrangement, the two busbars are plate-shaped and flat and enclose the resistor according to the invention between them.

The connection between the busbars on the one hand and the resistor on the other hand can be, for example, by a soldered connection, an adhesive connection or a sintered connection.

Alternatively, a spring clamp can be provided to crimp together the composite made from the busbars and the resistor, the spring clamp being configured at least on one side with electrical insulation.

BRIEF DESCRIPTION OF SEVERAL VIEWS OF THE DRAWINGS

Further advantageous embodiments of the invention are explained in more detail in the following drawings together with the description of the preferred embodiments of the invention, in which.

DESCRIPTION OF PREFERRED EMBODIMENTS OF THE INVENTION

Figure 1A:
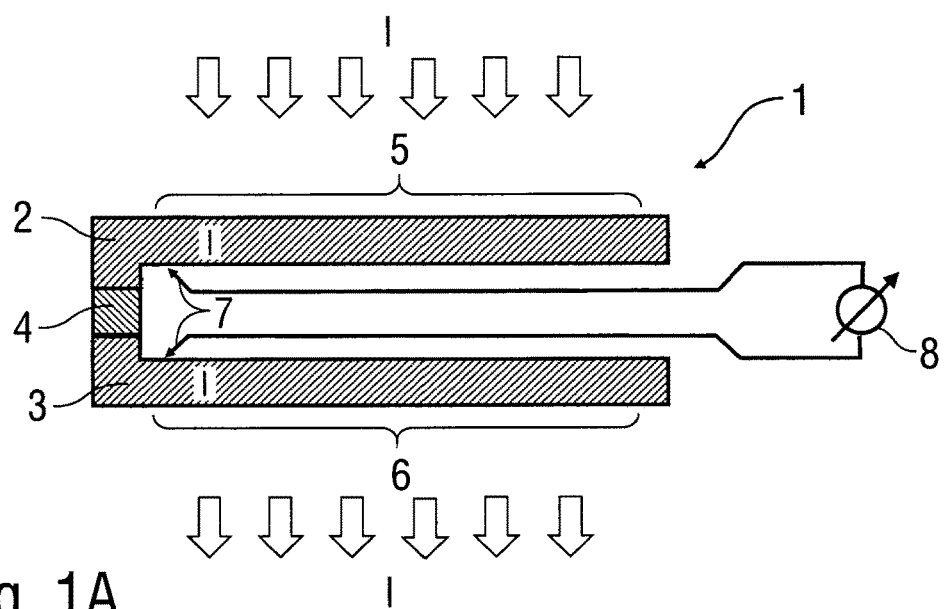
FIG. 1A is a cross-sectional view of a U-shaped bent current measuring resistor according to the invention, which is manufactured from a composite material strip.

FIG. 1A shows a cross-sectional view of a current measuring resistor 1 according to the invention for measuring current according to the known four-conductor method, the current resistor 1 being manufactured from a composite material strip.

The current measuring resistor 1 has a connection part 2 for conducting an electric current I in, said part consisting of a conductive material such as, for example, copper or a copper alloy.

In addition, the current measuring resistor 1 has a further connection part 3 to conduct the electric current I out of the current measuring resistor, the connection part 3 consisting of the same or another conductive material as the connection part 2.

A resistor element 4 is arranged in the current flow direction between the connection part 2 and the connection part 3, said element consisting of a low-resistance resistive material (e.g. copper-manganese-nickel alloy).

In addition, it should be mentioned that the conducting in and out of the electric current I covers a large area via current contact surfaces 5, 6. The extensive current contact surfaces 5, 6 enable a low-resistance transition resistance, which contributes to high measuring accuracy and low losses.

A particularity of the current measuring resistor 1 according to the invention consists in the construction design, which is U-shaped in cross-section at right-angles to the current flow direction. Thus, the two connection parts 2, 3 each form a limb of the U shape while the resistor element 4 is arranged in the base of the U shape.

Thus, the current contact surfaces 5, 6 lie opposite each other on the outer side of the two connection parts 2, 3.

It has already been mentioned above that the current measuring resistor 1 enables a current measurement according to the known four-conductor method. To this end, at least two voltage taps 7 are provided, which electrically contact the two connection parts 2, 3 as close as possible to the transition to the resistor element 4 and which are connected to a voltage measuring tool 8 represented only schematically here. The voltage measuring tool 8 therefore measures the voltage drop across the resistor element 4, the measured voltage drop reproducing the electric current I in accordance with Ohm's Law.

In addition, it should be mentioned that the electric current I flows in opposite directions in the two connection parts 2, 3, which leads to a pseudo-bifilar current path with correspondingly low inductance.

Figure 1B:
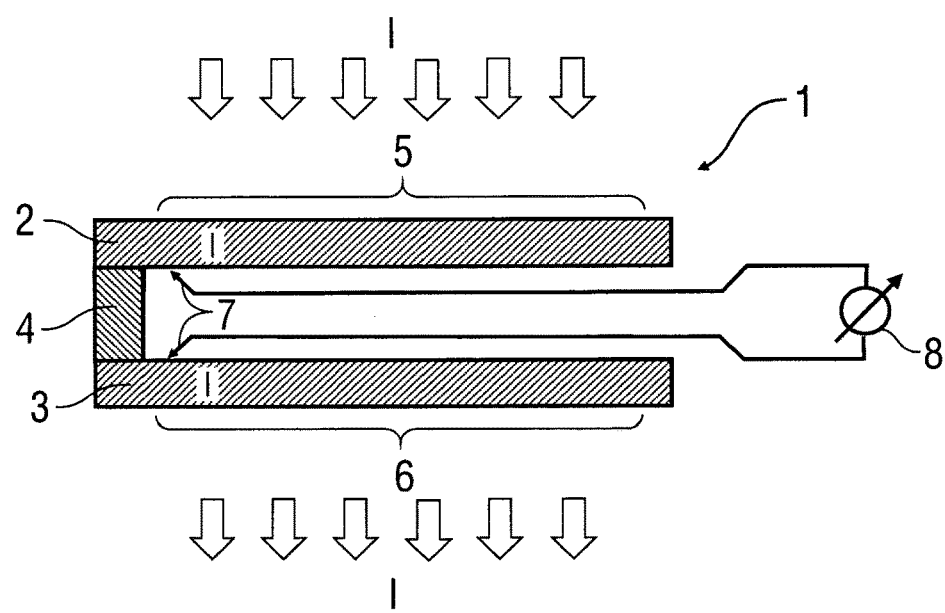
FIG. 1B is a modification of FIG. 1A, the current measuring resistor shown being manufactured from three parts.

FIG. 1B shows a modification from FIG. 1A so that to avoid repetitions reference is made to the preceding description.

A particularity of this modification consists therein that the current measuring resistor 1 is not manufactured from a composite material strip, but consists of three parts, namely the two connection parts 2, 3 and the resistor element 4.

Figure 2A:
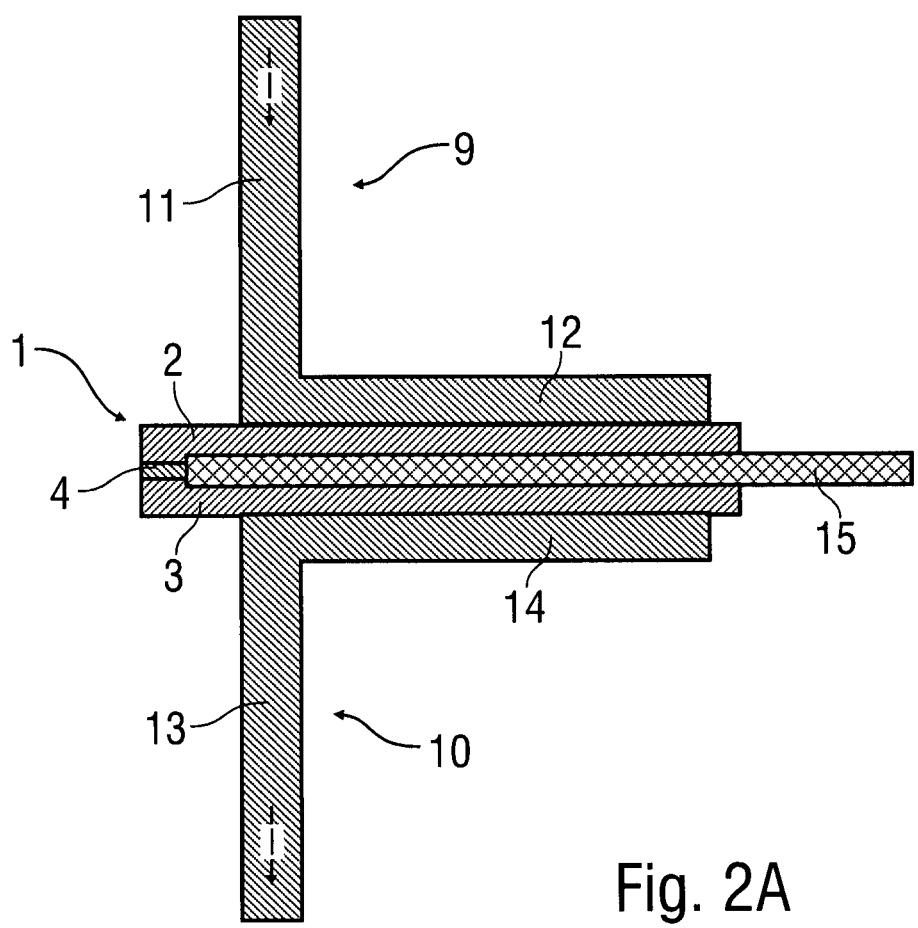
FIG. 2A is a modification of the current measuring resistor in FIG. 1A with an additional printed circuit board, the current measuring resistor being arranged between two busbars.
Figure 2B:
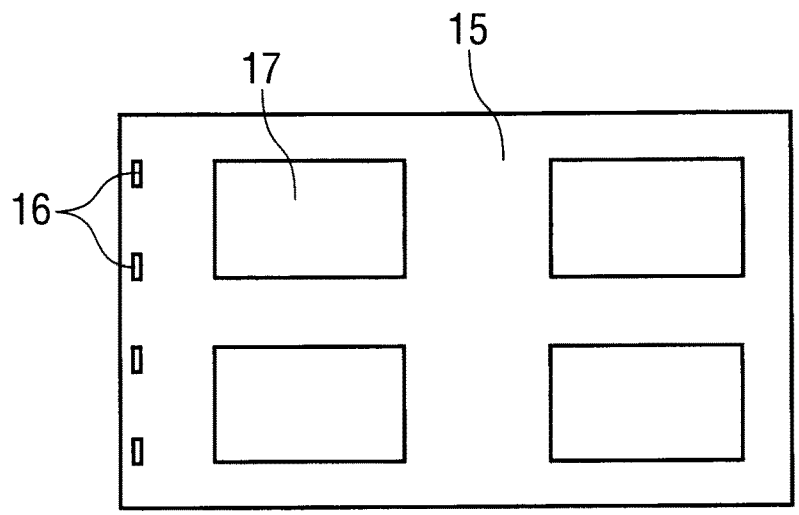
FIG. 2B is a top view of the printed circuit board of the current measuring resistor in FIG. 2A.

FIGS. 2A and 2B show a modification of the embodiment according to FIGS. 1A and 1B so that to avoid repetitions reference is made to the preceding description, with the same reference numerals being used for the corresponding details.

Firstly, FIG. 2A shows that the current measuring resistor 1 is electrically contacted by two busbars 9, 10, the two busbars 9, 10 each being L-shaped and each having two right-angled angled limbs 11, 12 and 13, 14.

In this arrangement, the current measuring resistor 1 is arranged between the two limbs 12, 14 and is electrically contacted by them. In contrast, the two other limbs 11, 13 of the busbars 9, 10 lie in the same plane and serve to supply and discharge the electric current I.

Secondly, it can be seen from FIG. 2A that a printed circuit board 15 is arranged in the inner space between the two connection parts 2, 3, said circuit board being shown in FIG. 2B in top view.

The printed circuit board 15 has a plurality of connection pads 16 both on its upper side and on its lower side, which form voltage taps for electrical contacting of the connection parts 2, 3. In this arrangement, the connection pads 16 are all arranged adjacent to each other perpendicularly to the current flow direction. In this arrangement, the current measuring resistor 1 therefore has a plurality of pairs of voltage taps, the pairs being arranged perpendicularly to the current flow direction distributed across the width of the current measuring resistor 1 and thus delivering differing voltage measurement values, since the current density is not spatially constant even within the connection parts 2, 3 because the electrical conductivity of the conductive material of the connection parts 2, 3 is not infinite. However, measurement by a plurality of pairs of voltage taps enables these spatial fluctuations in the voltage measurement value to be compensated using measurement methods.

In addition, the printed circuit board 15 has a plurality of soldering support surfaces 17 to mechanically stabilize the whole composite of the current measuring resistor when soldering, sintering or gluing.

In addition, it should be mentioned that the printed circuit board 15 preferably supports a measurement circuit (not shown) to analyze the voltage measurement values of the voltage taps (connection pads 16) using measurement methods. For example, this measurement circuit can be configured as a customer-specific circuit (ASIC: Application-Specific Integrated Circuit), as known per se from EP 1 363 131 A1.

Moreover, the printed circuit board 15 can also support an optocoupler or an inductive or capacitive coupler (not shown) in order to enable galvanically isolated communication with the environment. Alternatively, a voltage measurement value can be emitted via the optocoupler, said value reproducing the voltage drop across the resistor element 4.

Figure 3:
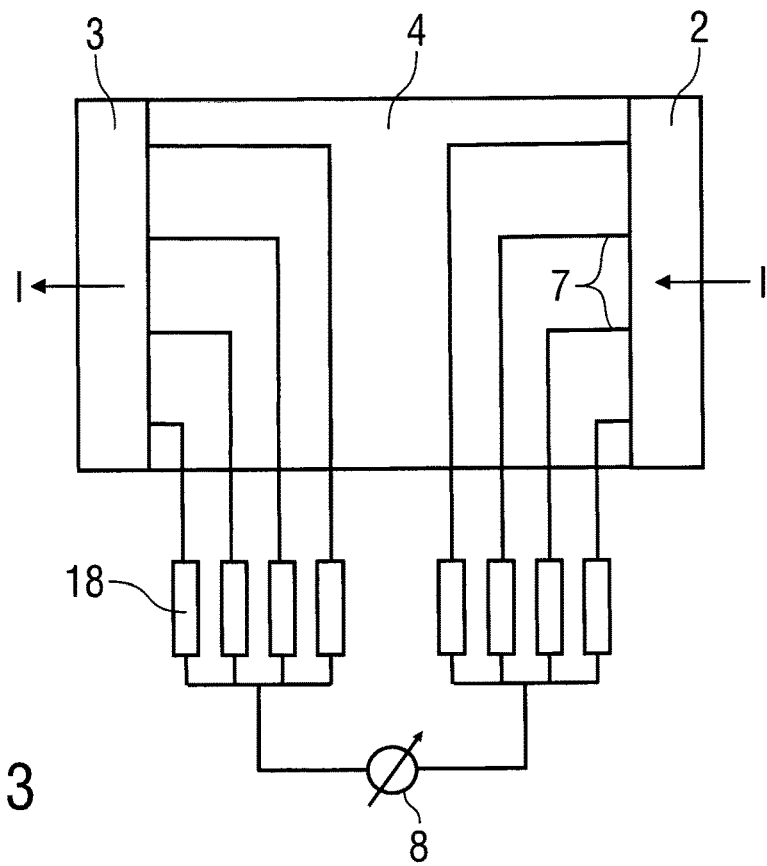
FIG. 3 is a schematic representation of a current measuring resistor according to the invention with a plurality of pairs of voltage taps for compensating spatial fluctuations in current density.

FIG. 3 shows a modification of the current measuring resistor according to the invention so that to avoid repetitions reference is made to the preceding description, with the same reference numerals being used for the corresponding details.

In this arrangement, the current measuring resistor 1 has numerous pairs of voltage taps 7, which are arranged perpendicularly to the current flow direction distributed across the width of the current measuring resistor 1 and in each case contacting the two connection parts 2 and 3. The voltage taps 7 deliver different voltage measurement values as the current density is not exactly spatially constant in the connection parts 2, 3. The voltage taps are thus connected to the voltage measuring tool 8 via balancing resistors 18. In this arrangement, the resistance values of the individual balancing resistors 18 are adapted to the spatial position of the voltage taps 7 so that spatial fluctuations in the voltage measurement values are compensated.

Figure 4:
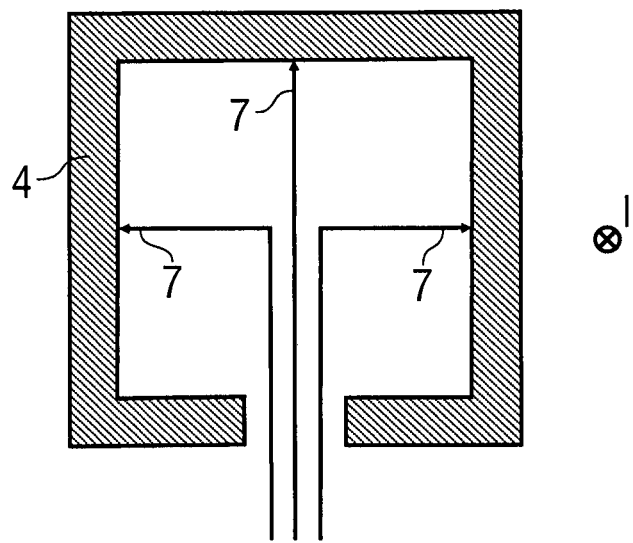
FIG. 4 is a further modification of the resistor element of a current measuring resistor according to the invention, which is angled several times perpendicularly to the current flow direction.

FIG. 4 shows a modification from the embodiments described above so that to avoid repetitions reference is made to the preceding description. In this arrangement, the diagram shows a cross-section through the resistor element 4 at right angles to the current flow direction, the current flow direction being directed in the plane of projection.

The connection parts 2, 3 are not shown in this arrangement and run in front of and behind the plane of projection, the plate-shaped connection parts 2, 3 running parallel to the plane of projection and thus electrically contacting on opposite sides the end face of the resistor element 4 shown in the drawing, i.e. in front of and behind the plane of projection.

A particularity of this embodiment consists therein that the current measuring resistor 1 is not exactly U-shaped in cross-section and is thus preferably manufactured from three parts.

Figure 5:
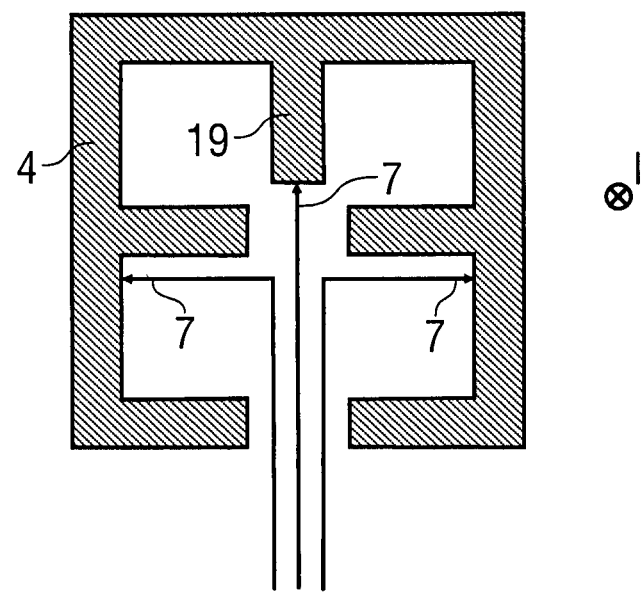
FIG. 5 is a cross-sectional view through a modification of the resistor element according to FIG. 4 with a plurality of webs projecting inwards.

FIG. 5 shows a further modification of an embodiment according to the invention so that to avoid repetitions reference is made to the preceding description, with the same reference numerals being used for the corresponding details.

A particularity of this embodiment consists therein that webs 19 project inwards from the resistor element 4.

Here, the voltage taps 7 contact the two connection parts 2, 3 in each case in direct proximity to the resistor element 4, e.g. on the base of one of the webs 19. The positions of the connection points can be adapted to design and measurement requirements.

Figure 6A:
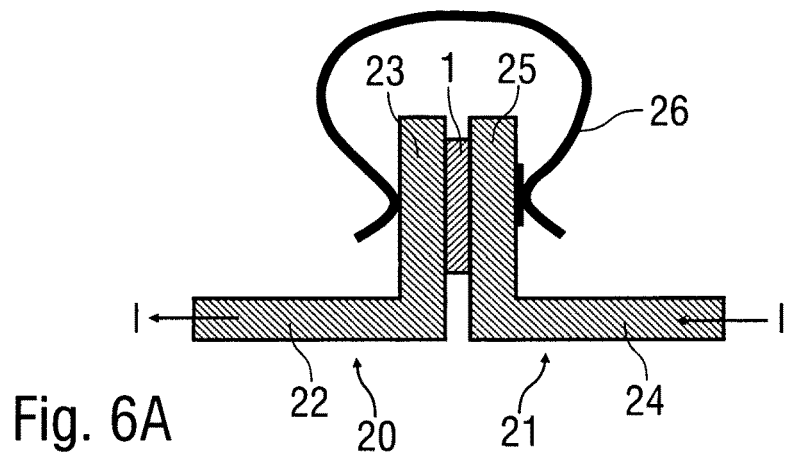
FIGS. 6A-6C are different variants of busbar arrangements with a current measuring resistor according to the invention.
Figure 6B:
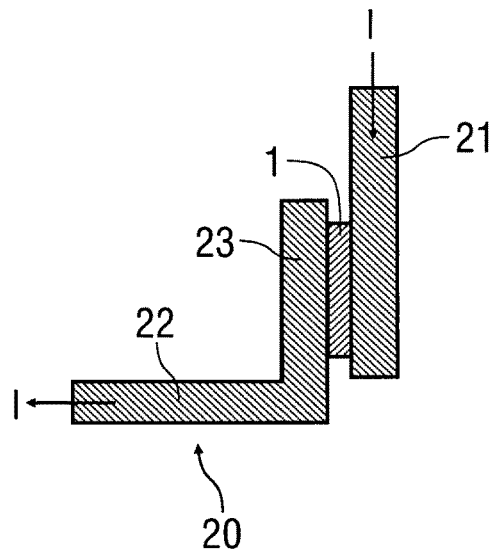
Figure 6C:
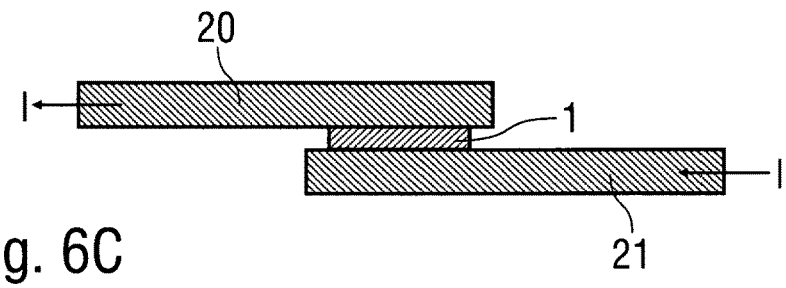

FIGS. 6A to 6C show different variants of a busbar arrangement according to the invention with a current measurement resistor 1 according to the invention, which is electrically contacted by two busbars 20, 21.

In the variant according to FIG. 6A, the two busbars 20, 21 are each L-shaped with two right-angled limbs 22, 23 and 24, 25 angled towards each other. In this arrangement, the current measurement resistor 1 is enclosed between the two limbs 23, 25 while the two other limbs 22, 24 lie in the same plane and serve to supply and discharge the current I.

In addition, FIG. 6A also shows a spring clamp 26, which crimps the two limbs 23, 25 of the busbars 20, 21 onto the current contact surfaces 5, 6 of the current measuring resistor, the spring clamp 26 being electrically isolated at least on one side.

In the variant according to FIG. 6B, only the busbar 20 is L-shaped in cross-section, while the other busbar 21 is plate-shaped and flat.

In the variant according to FIG. 6C, the two busbars 20, 21 are plate-shaped and project from the current measuring resistor 1 in different directions.

The invention is not restricted to the preferred embodiments described above. Rather, a plurality of alternatives and modifications are possible, which also make use of the inventive concepts and thus fall within the scope. In particular, the invention also claims protection for the subject and the features of the subclaims independently of each of the claims referred to, i.e., for example, also with the characterizing feature of the main claim.

LIST OF REFERENCE NUMERALS

1 Current measuring resistor
2 Connection part for conducting the current in
3 Connection part for conducting the current out
4 Resistor element
5 Current contact surface
6 Current contact surface
7 Voltage taps
8 Voltage measuring tool
9 Busbar
10 Busbar
11 Limb of busbar 9
12 Limb of busbar 9
13 Limb of busbar 10
14 Limb of busbar 10
15 Printed circuit board
16 Connection pads
17 Soldering support surfaces
18 Balancing resistors
19 Webs
20 Busbar
21 Busbar
22 Limb of busbar 20
23 Limb of busbar 20
24 Limb of busbar 21
25 Limb of busbar 21
26 Spring clamp
I Current

The invention claimed is:

1. A resistor comprising
    a) a first connection part comprising a conductive material for conducting an electric current into the resistor,
    b) a second connection part comprising a conductive material for conducting the electric current out of the resistor, wherein the first connection part and the second connection part are collectively referred to hereinafter as connection parts,
    c) a resistor element comprising a resistive material, the resistor element being arranged in a direction of current flow between the first connection part and the second connection part so that the electric current flows through the resistor element, and
    d) several voltage taps which electrically contact the connection parts and measure a voltage drop across the resistor element,
    e) wherein the connection parts have a really extensive current contact surfaces to conduct the current in and out, and
    f) at least one part of the resistor is essentially U-shaped in cross-section, and
    g) the voltage taps are attached on an inner side of the connection parts, and
    h) the current contact surfaces are attached on an outer side of the connection parts, and
    i) the connection parts enclose an inner space, and
    j) at least one part of a measurement device is arranged in the inner space, the measurement device being installed to measure the voltage drop across the resistor element.

2. The resistor according to claim 1, wherein the U-shaped part of the resistor has limbs that are formed by the connection parts and a base that is formed by the resistor element.

3. The resistor according to claim 2, wherein the current contact surfaces of the connection parts are essentially arranged as two contact surfaces parallel and spaced apart from each other.

4. The resistor according to claim 1, wherein the connection parts are each contacted by a plurality of pairs of voltage taps, which are arranged adjacently in the direction of current flow and distributed across a width of the connection parts.

5. The resistor according to claim 4, wherein the voltage taps are connected via balancing resistors to a signal output, the balancing resistors compensating asymmetries in a current density in the resistor element through appropriately adjusted resistance values.

6. The resistor according to claim 1, wherein
    a) the measurement device comprises a printed circuit board which has soldering support surfaces to mechanically stabilize the resistor, and
    b) the printed circuit board has connection pads which as voltage taps electrically contact the connection parts to measure the voltage drop across the resistor element, and
    c) the printed circuit board is multilayered, the connection pads and the soldering support surfaces being arranged on outer layers of the printed circuit board, and
    d) the connection pads of the printed circuit board for the voltage taps on the outer layers of the printed circuit board are connected by through-holes to striplines on an inner layer of the printed circuit board, and
    e) the striplines run over each other on opposite-lying sides of the inner layer under cover, and
    f) the printed circuit board is connected to the connection parts by one of the following connection types:

f1) a soldered connection,
f2) a sintered connection,
f3) a crimped connection, or
f4) an adhesive connection with an electrically conductive adhesive.

7. The resistor according to claim 6, wherein the printed circuit board is rigid.

8. The resistor according to claim 6, wherein the printed circuit board is flexible.

9. The resistor according to claim 6, wherein the printed circuit board is resistant to high temperatures up to a temperature of at least +150° C.

10. The resistor according to claim 6, wherein the printed circuit board comprises multilayer ceramics.

11. The resistor according to claim 6, wherein the printed circuit board supports a measuring circuit for measuring the voltage drop across the resistor element.

12. The resistor according to claim 6, wherein the printed circuit board supports an optocoupler for galvanically isolated output of data or of an analog signal.

13. A resistor comprising:
   a) a first connection part comprising a conductive material for conducting an electric current into the resistor,
   b) a second connection part comprising a conductive material for conducting the electric current out of the resistor, wherein the first connection part and the second connection part are collectively referred to hereinafter as connection parts,
   c) a resistor element comprising a resistive material, the resistor element being arranged in a direction of current flow between the first connection part and the second connection part so that the electric current flows through the resistor element, and
   d) several voltage taps which electrically contact the connection parts and measure a voltage drop across the resistor element,
   e) wherein the connection parts have a really extensive current contact surfaces to conduct the current in and out, and
   f) at least one part of the resistor is essentially U-shaped in cross-section, and
   g) the voltage taps are attached on an inner side of the connection parts, and
   h) the current contact surfaces are attached on an outer side of the connection parts, and
   i) the resistor element has a cross-sectional shape in a cross-section at right angles to the direction of current flow, said shape deviating from a pure rectangular shape, and
   j) the resistor element is multiply bent or angled perpendicularly to the direction of current flow so that it surrounds an inner space and at least partially encloses it, and
   k) the resistor element has at least one limb, which extends in the direction of current flow and projects internally into the inner space, and
   l) at least one voltage tap is attached to each of the connection parts in a proximity of one of the limbs.

14. The resistor according to claim 1, further comprising at least one of the following features:
   a) the connection parts are each plate-shaped,
   b) the resistor element is plate-shaped,
   c) the conductive material of the connection parts is copper or a copper alloy or aluminum,
   d) the resistive material is a copper-manganese alloy,
   e) the resistive material of the resistor element has a greater specific electrical resistance than the conductive material of the connection parts,
   f) the resistive material of the resistor element has a specific electrical resistance, which is
      f1) less than $50 \cdot 10^{-7}$ Ωm, and
      f2) greater than $1 \cdot 10^{-8}$ Ωm,
   g) the resistor has a resistance value, which is
      g1) at least 0.1 µΩm, and
      g2) a maximum of 1000 µΩ,
   h) the resistor has a continuous current-carrying capacity of at least 100A,
   i) the current contact surfaces each have a size that is at least 30% of a total outer surface of the resistor,
   j) the current contact surfaces each have a size that is at least 5 cm$^2$,
   k) the direction of current flow in the first connection part is opposite to the direction of current flow in the second connection part,
   l) the resistor has a thickness that is at least 1 mm and a maximum of 20 mm,
   m) the resistor has a resistance value with a temperature coefficient of less than 500 ppm/K,
   n) the resistor has an inductance of less than 10 nH,
   o) a thermal resistance between the current contact surfaces is less than 10 K/W,
   p) the connection parts and the resistor element made from a composite material strip are detached and bent perpendicularly to a longitudinal direction of the composite material strip,
   q) the connection parts are constructed in a plate shape, lying over each other sandwich-like and separately connected to each other by a method selected from the group consisting of soldering, welding, gluing and sintering,
   r) the current flow surfaces are aligned with their contacting sides opposite each other,
   s) the resistor has a length in the direction of current flow that is greater than 20 mm and less than 100 mm,
   t) the resistor has a width perpendicular to the direction of current flow that is greater than 20 mm and less than 200 mm, and
   u) the resistor has a thickness perpendicular to the direction of current flow that is greater than 2 mm and less than 50 mm.

15. A busbar arrangement comprising:
   a) a first busbar to supply an electric current,
   b) a second busbar to discharge the electric current, wherein the first busbar and the second busbar are collectively referred to hereinafter as two busbars, and
   c) an electrical resistor that is arranged in a current flow direction between the two busbars so that the electric current flows through the electrical resistor,
   d) wherein the electrical resistor is a resistor according to claim 1.

16. The busbar arrangement according to claim 15, wherein
   a) the two busbars each have two limbs angled towards each other,
   b) a first limb pair of limbs of the two busbars lies in a common plane,
   c) a second limb pair of limbs of the two busbars lies in parallel planes spaced apart from each other, and
   d) the second limb pair encloses the electrical resistor within it and electrically contacts the electrical resistor.

17. The busbar arrangement according to claim 15, wherein a) one of the two busbars has two limbs angled towards each other, b) the other of the two busbars is plate-shaped and flat, c) one limb of the angled busbar is arranged parallel to the plate-shaped busbar, d) the plate-shaped busbar and the limb parallel to it of the angled busbar encloses the electrical resistor therein and electrically contacts the electrical resistor.

18. The busbar arrangement according to claim 15, wherein a) the two busbars are each plate-shaped and flat at least in a region of contacting with the resistor, and b) the two busbars are arranged parallel and spaced apart from each other at least in the region of contacting with the resistor, and c) the two busbars enclose the resistor therein and electrically contact the resistor in the region of contacting with the resistor.

19. The busbar arrangement according to claim 18, wherein the two busbars are spaced apart from the resistor in opposite directions so that the current flow direction is identical in the two busbars.

20. The busbar arrangement according to claim 18, wherein the two busbars are spaced apart from the resistor in the same direction so that the current flow direction in the two busbars is opposite.

21. The busbar arrangement according to claim 15, further comprising a spring clamp for crimping the two busbars, the spring clamp being electrically isolating on at least one side.

22. The busbar arrangement according to claim 15, further comprising a soldered connection between, on the one hand, the two busbars and, on the other hand, the resistor.

23. The busbar arrangement according to claim 15, further comprising an adhesive connection between, on the one hand, the two busbars and, on the other hand, the resistor.

24. The busbar arrangement according to claim 15, further comprising a sintered connection between, on the one hand, the two busbars and, on the other hand, the resistor.

* * * * *